(12) United States Patent
Bhatia

(10) Patent No.: US 9,383,407 B2
(45) Date of Patent: Jul. 5, 2016

(54) INSTANTANEOUS IR DROP MEASUREMENT CIRCUIT

(71) Applicant: Apple Inc., Cupertino, CA (US)

(72) Inventor: Ajay K. Bhatia, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 332 days.

(21) Appl. No.: 14/054,872

(22) Filed: Oct. 16, 2013

(65) Prior Publication Data

US 2015/0102833 A1 Apr. 16, 2015

(51) Int. Cl.
*G01R 31/02* (2006.01)
*G01R 31/28* (2006.01)
*G01R 19/165* (2006.01)
*G06F 1/00* (2006.01)
*G11C 5/00* (2006.01)
*G06F 1/30* (2006.01)

(52) U.S. Cl.
CPC ...... *G01R 31/2884* (2013.01); *G01R 19/16552* (2013.01); *G01R 31/2879* (2013.01); *G01R 31/2856* (2013.01); *G06F 1/00* (2013.01); *G06F 1/305* (2013.01); *G11C 5/00* (2013.01); *G11C 2207/00* (2013.01)

(58) Field of Classification Search
CPC ......... G06F 1/00; G06F 2101/00; G11C 5/00; G11C 2207/00
See application file for complete search history.

(56) References Cited

U.S. PATENT DOCUMENTS

| 6,038,187 | A | * | 3/2000 | El Hajji | ............... | G11C 11/406 365/189.04 |
|---|---|---|---|---|---|---|
| 7,649,373 | B2 | | 1/2010 | Tokunaga | | |
| 2004/0174570 | A1 | * | 9/2004 | Plunkett | ............... | B41J 2/04505 358/3.13 |
| 2005/0184799 | A1 | * | 8/2005 | Kii | .......... | G06F 1/305 327/545 |
| 2009/0072810 | A1 | | 3/2009 | Lee et al. | | |
| 2011/0050247 | A1 | * | 3/2011 | Marshall | .......... | G01R 31/31725 324/617 |
| 2011/0122670 | A1 | * | 5/2011 | Yamazaki | .......... | G11C 16/0433 365/72 |
| 2011/0193594 | A1 | * | 8/2011 | Inukai | .................... | H03K 5/133 326/112 |
| 2012/0126781 | A1 | | 5/2012 | Narayanan et al. | | |
| 2012/0166854 | A1 | | 6/2012 | Rotem et al. | | |
| 2013/0043916 | A1 | * | 2/2013 | Sippel | .................. | H03K 3/0315 327/149 |
| 2013/0127441 | A1 | | 5/2013 | Tseng et al. | | |
| 2013/0271196 | A1 | * | 10/2013 | Cao | .................. | G01R 31/31725 327/199 |

* cited by examiner

*Primary Examiner* — Huy Q Phan
*Assistant Examiner* — Temilade Rhodes-Vivour
(74) *Attorney, Agent, or Firm* — Meyertons, Hood, Kivlin & Goetzel, P.C.; Erik A. Heter

(57) ABSTRACT

A circuit for measuring instantaneous voltage drops in an IC is disclosed. In one embodiment, a measurement circuit is configured to perform measurements of a voltage drop between a supply voltage node and reference (e.g., ground) node. The measurement circuit may perform consecutive voltage measurements over a number of clock cycles. The measurements may be compared to a reference voltage, and the results of the comparisons may be provided to a register unit. The register unit may include a number of storage locations indicating at which cycles, if any, voltage droops have occurred. Additionally, the register may store information indicating maximum and minimum voltage droops.

18 Claims, 7 Drawing Sheets

INSTANTANEOUS IR DROP MEASUREMENT CIRCUIT

BACKGROUND

1. Technical Field

This disclosure is directed to integrated circuits, and more particularly, to circuits for measuring voltage drops in integrated circuits.

2. Description of the Related Art

Modern integrated circuits (ICs) can have transistor counts that number in the hundreds of millions, and in some cases, over a billion. These transistors may be arranged to form logic circuits and, more generally, switching circuitry. While it is possible that multiple power domains may exist on a single IC, it is nevertheless possible that some power domains provide power to circuitry having a large number of transistors relative to the overall number implemented on the IC.

During operation of the IC, it is possible that a number of transistors may switch concurrently/simultaneously. In such instances, the amount of current demanded by the circuits can change significantly as a result of the switching. This can in turn lead to a temporary drop in the supply voltage (commonly referred to as voltage 'droop') for the particular power domain in which the transistors are implemented. To counter the effects of voltage droop, capacitors may be coupled between the supply voltage node and a reference node (e.g., ground). Nevertheless, significant voltage droops may still occur if enough circuits switch at the same time. However, due to the capacitance between the supply voltage node and the reference node, the voltage will eventually stabilize.

SUMMARY

A circuit for measuring instantaneous voltage drops in an IC is disclosed. In one embodiment, a measurement circuit is configured to perform measurements of a voltage drop between a supply voltage node and reference (e.g., ground) node. The measurement circuit may perform consecutive voltage measurements over a number of clock cycles. The measurements may be compared to a reference voltage, and the results of the comparisons may be provided to a register unit. The register unit may include a number of storage locations indicating at which cycles, if any, voltage droops have occurred. Additionally, the register may store information indicating maximum and minimum voltage droops.

In one embodiment, a method includes performing a series of consecutive voltage measurements, one per each of a plurality of cycles of a clock signal generated by an oscillator circuit. Each of the voltage measurements is compared to a reference voltage. Indications of a voltage droop may be recorded in a register, as well as indications of in which cycles maximum and minimum voltage droops occurred.

BRIEF DESCRIPTION OF THE DRAWINGS

The following detailed description makes reference to the accompanying drawings, which are now briefly described.

Figure 1:
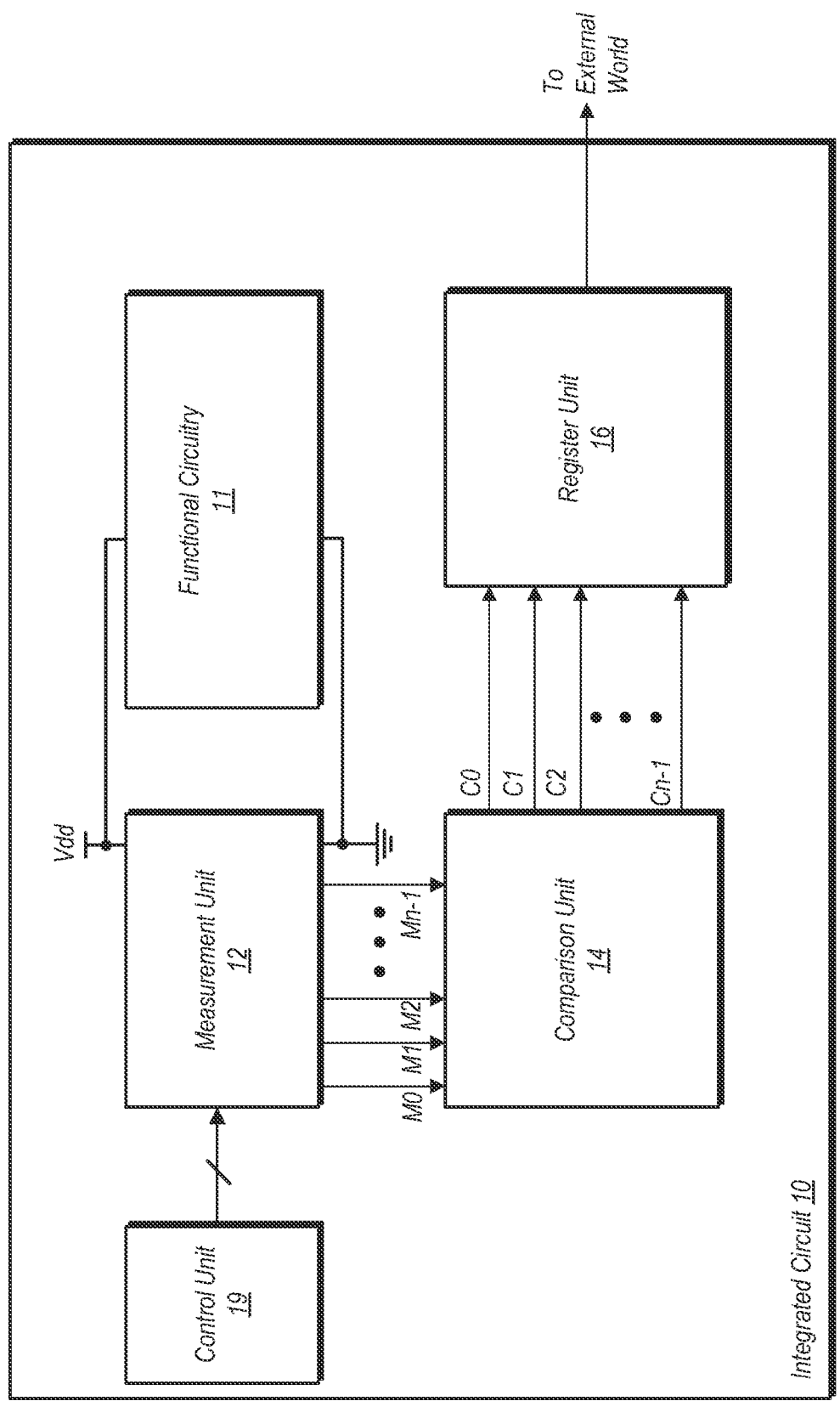
FIG. 1 is a block diagram of one embodiment of an IC including circuitry configured to measure voltage drops.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of an IC 10 is shown. In the embodiment shown, IC 10 includes functional circuitry 11 that is configured to perform the function of the IC. It is noted that the embodiment shown here is a simplified version for the sake of explanation. However, embodiments having additional functional units, multiple power domains, and so forth, are possible and contemplated.

IC 10 in the embodiment shown includes circuitry for measuring and recording instantaneous voltage drops. The circuitry includes a control unit 19, a measurement unit 12, a comparison unit 14, and a register unit 16. These units may work together to determine and record occurrences of a voltage droop in the supply voltage, Vdd, that may result from the switching of a number of circuits concurrently or simultaneously. As defined herein, a voltage droop may be a temporary drop in the supply voltage that occurs when circuits switch and change the current demand on the power source. A voltage droop may be further defined as a drop in the supply voltage resulting from varying current demands that accompany the switching of a number of circuits, and in which the value of the supply voltage falls to a level that is outside of a tolerance (or guard band). For example, a supply voltage may have a tolerance of ±5%, and a voltage droop may in this case be defined as an occurrence of the voltage temporarily falling more than 5% of its defined value.

In the embodiment shown, control unit 19 may provide one or more control signals to measurement unit 12 in order to initiate measurement of the supply voltage. Responsive thereto, measurement unit 12 may perform measurements of the supply voltage across a number of cycles. In one embodiment, these measurements may be performed in consecutive cycles, with one measurement performed each cycle. The results of the measurements, e.g., M0, M1, M2, etc., may be output to comparison unit 14. Comparison unit 14 may compare the measurements to a reference voltage. The results of the comparisons, C0, C1, C2, etc., may be forwarded to register unit 16, where the result are stored and eventually output to the external world for analysis. In some embodiments, comparison unit 14 may be configured not only to detect whether a voltage droop has occurred based on the comparisons of the measurements to the reference voltage, but may also be configured to determine the magnitude of detected voltage droops. For example, the comparisons may be performed by analog circuitry which can generate a signal proportional to the voltage droop. The analog signal may then be converted into a digital value that indicates the magnitude of the droop. Register unit 16 may thus store not only information indicating those cycles upon which a voltage droop occurred, but also the magnitude of such droop. Register unit 16 may further include circuitry to determine a maximum and minimum voltage droop (in terms of magnitude of the droop), and store these values as well as the cycles upon which they were detected.

Figure 2:
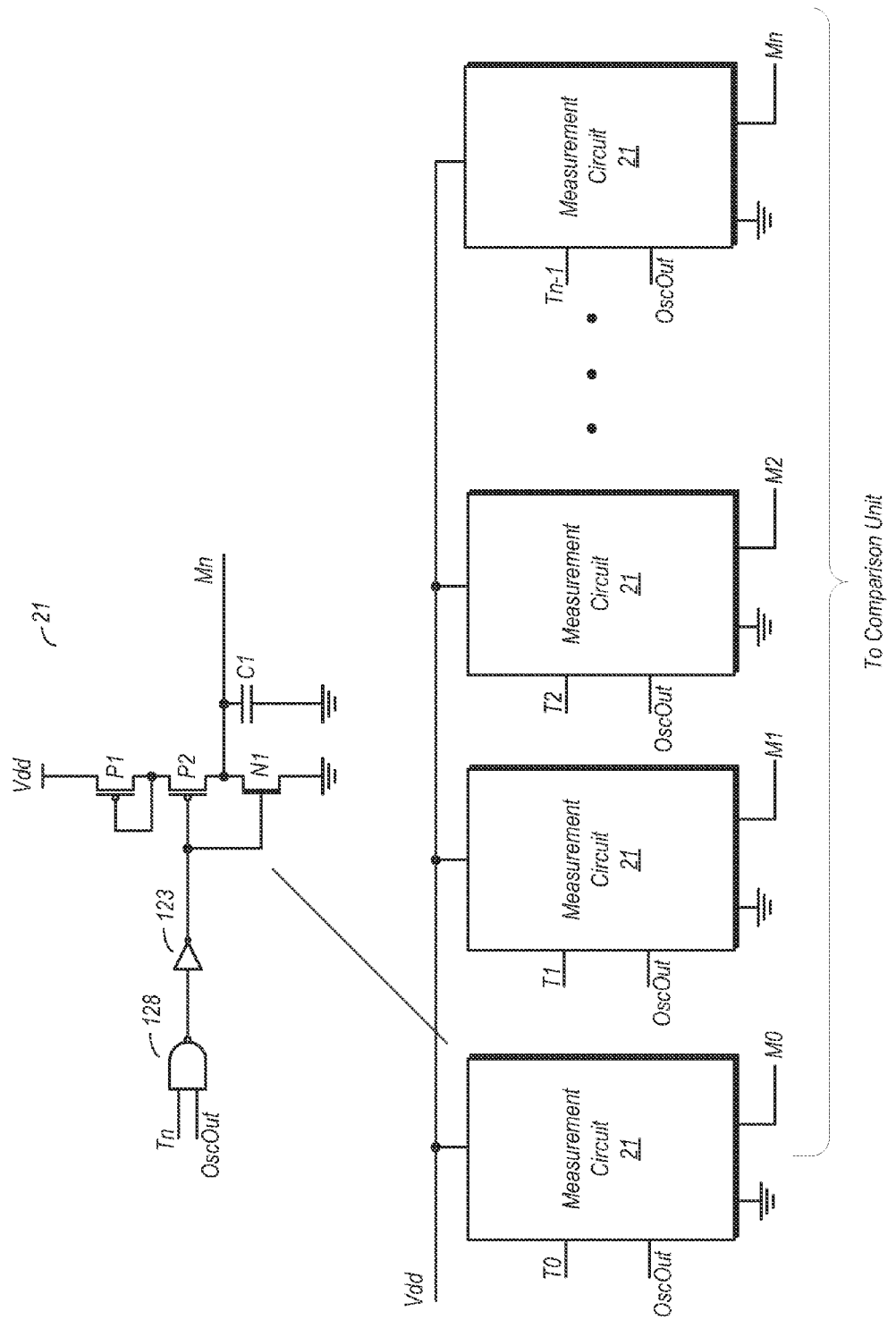
FIG. 2 is a diagram illustrating a portion of one embodiment of a measurement unit.

FIG. 2 is a diagram illustrating a portion of one embodiment of a measurement unit. Measurement unit 12 includes a number of measurement circuits 21. In the embodiment shown, each measurement circuit 21 is coupled between Vdd (a voltage supply node) and ground (a reference node). Each measurement circuit 21 is coupled to receive two input signals, T (e.g., T0 on the measurement circuit 21 furthest to the left) and OscOut. The generation of these signals is discussed below in reference to FIG. 3. Each measurement circuit 12 is further coupled to output a measured voltage, M (e.g., M0 on the measurement circuit 21 furthest to the left). The measured voltage may be an analog signal having a magnitude indicative of the measured value.

A total of n measurement circuits may be implemented in various embodiments. The exact number may vary from one embodiment to the next, and may be determined as desired. The measurement circuits 21 are arranged, along with other circuitry discussed below, such that only one measurement circuit is active at a time. The measurement circuits 21 may perform measurements over a n cycles of operation, beginning with cycle 0 and ending with cycle n-1. During the performance of measurements, only one measurement circuit 21 is active at a given time. In the embodiment shown, a first measurement circuit 21 may measure and output M0 on a first cycle, a second measurement circuit may measure and output M1 on the next cycle, and so on, until a last measurement circuit 21 measures and outputs Mn-1. The measurements may be repeated as desired, or the measurement circuits may be held in an inactive state if no measurements are desired.

The ability to perform consecutive measurements using multiple circuits may allow the detection of voltage droops at high frequencies that may otherwise not be measurable. This information may be used in a number of different ways, including characterization of the IC and the performance of debug operations.

An exemplary measurement circuit 21 is shown at the top of the drawing. In the example shown, measurement circuit includes a transistor stack comprising transistors P1, P2, and N1 (where P1 and P2 are PMOS devices, while N1 is an NMOS device). Transistors P2 and N1 form an inverter. The output of the inverter, at the junction of P2 and N1, is coupled to a capacitor C1. In turn, capacitor C1 is coupled between the inverter output and ground. Measurement circuit 21 in this embodiment is considered inactive when a low is provided to the gate terminals of P2 and N1. During this time, capacitor C1 may charge. The amount of charge present on C1, and the voltage of Mn, may be determined in part by the operation of transistor P1 and P2. When a voltage droop occurs, the amount of charge and thus the voltage on the output Mn may be smaller than at times when no voltage droop is occurring. In particular, if the voltage on Vdd falls due to a droop, it is possible for capacitor C1 to partially discharge through transistors P1 and P2.

Measurement circuit 21 may be activated responsive to assertion of both the T and OscOut signals on the inputs terminals of NAND gate 128. As a result of a high on both of these terminals, inverter 123 may output a logic high to the gate terminals of P1 and P2. This causes the deactivation of P2 and the activation of N1. Capacitor C1 may begin discharging through transistor N1 when this device is active. The voltage Mn may fall when C1 discharges through N1. The amount that the voltage on Mn falls is in part dependent on its initial starting voltage. Thus, if Vdd is within its tolerance range, the final voltage on Mn will be greater than if Vdd is undergoing a voltage droop. Thus, the final voltage of Mn at the end of the measurement cycle may indicate the occurrence (and magnitude) of a voltage droop.

Figure 3:
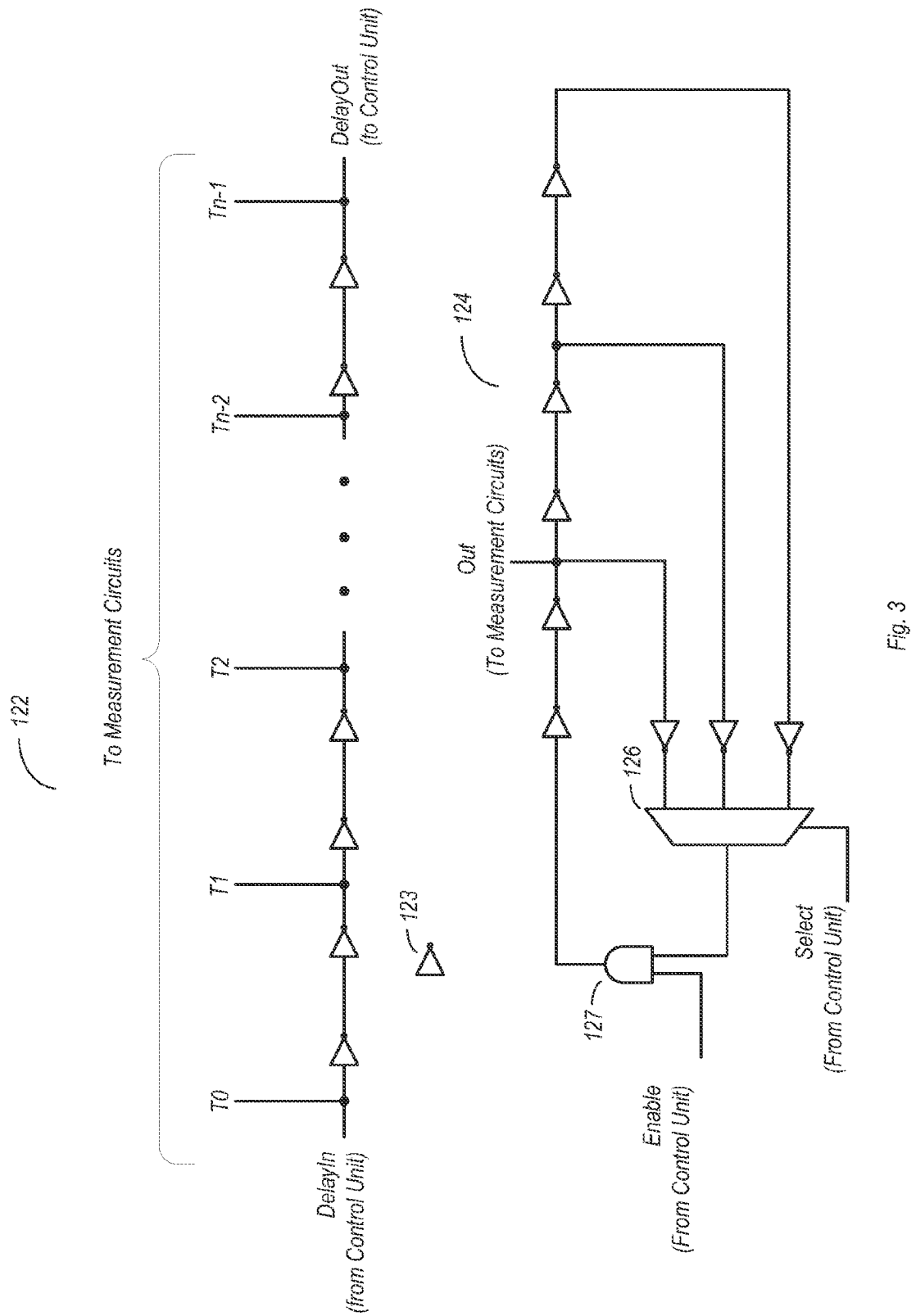
FIG. 3 is a diagram illustrating an oscillator and a delay unit utilized in one embodiment of a measurement circuit.

Turning now to FIG. 3, a delay unit and a ring oscillator are shown. Delay unit 122 and ring oscillator 124 may be implemented in measurement unit 12 in order to control the operation of measurement circuits 21.

Delay unit 122 is a chain of serially-coupled inverters configured to receive an input signal, DelayIn, from the control unit. The signal may be sent as a pulse having a predetermined width, and this pulse may propagate through delay unit 122 such that only one of the outputs T (at the taps between every other inverter) is asserted at a given time. Thus, an output T0 is initially asserted and de-asserted, followed by T1, followed by T2, and so on. These signals are provided to their respectively coupled measurement circuits 21.

Ring oscillator 124 in the embodiment shown includes a number of inverters 123 that form a number of different rings. These different rings can generate periodic signals having different frequencies. The desired frequency may be selected using Select signals input into multiplexer 126. The output of multiplexer 126 is provided to AND gate 127, which is also coupled to receive an Enable signal from the control unit. When the enable signal is asserted in this embodiment, ring oscillator 124 may operate, otherwise it is disabled.

Ring oscillator 124 in the embodiment shown includes one tap to provide an output signal, Out. This signal is provided to the OscOut inputs of the measurement circuits 21. When both the T and OscOut inputs of a given measurement circuit 21 are both at asserted levels, the measurement circuit 21 is activated.

It is noted that while a ring oscillator and a delay line are used to perform the control functions discussed herein, embodiments that use other types of circuitry to perform these functions (e.g., counters and other combinational logic circuitry) are also possible and contemplated.

Figure 4:
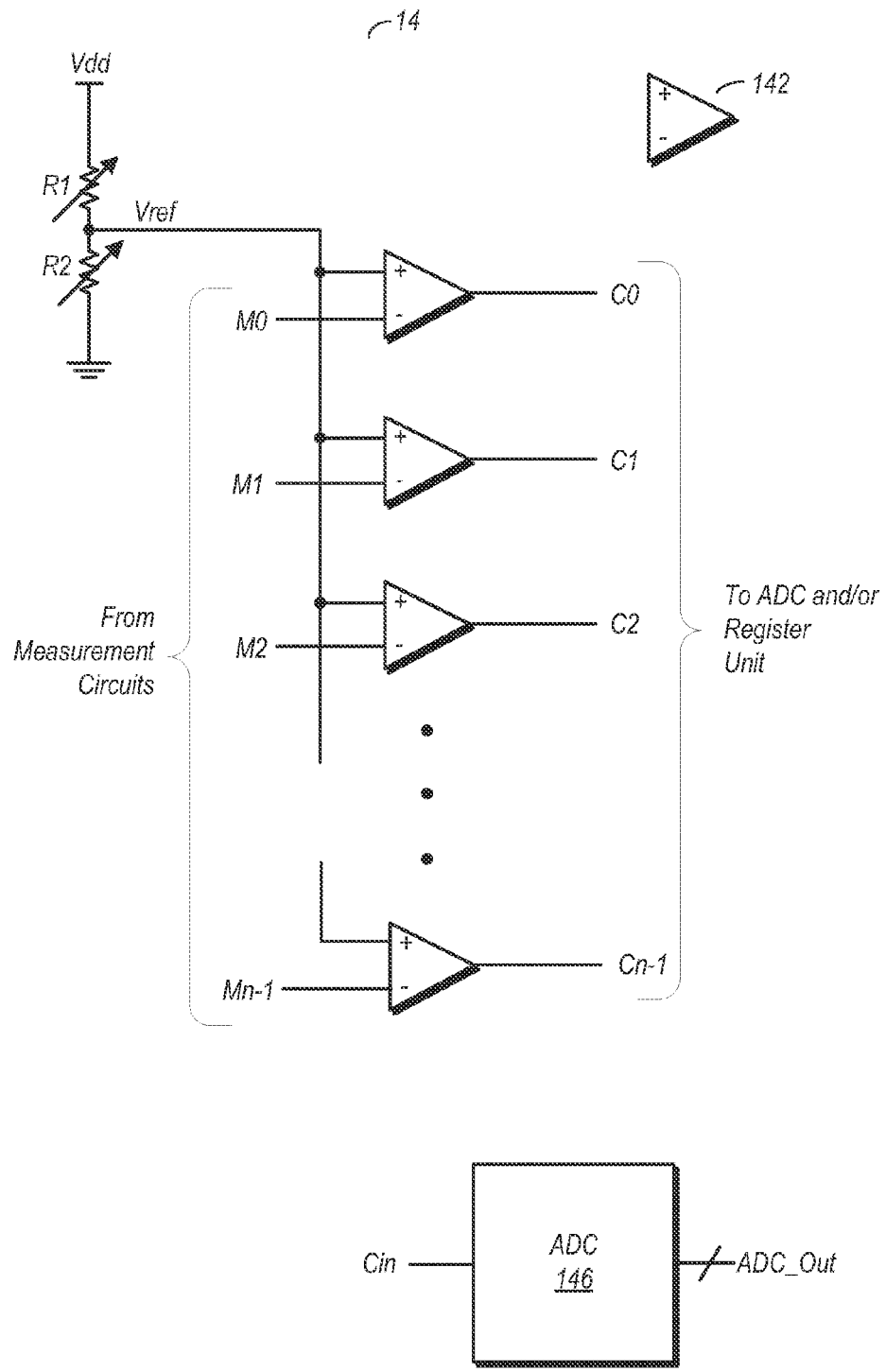
FIG. 4 is a diagram illustrating one embodiment of a comparison unit.

FIG. 4 is a diagram illustrating one embodiment of a comparison unit 14. In the embodiment shown, comparison unit 14 includes a number of comparators 142, which may output a digital value in some implementations, or an analog value in other implementations. The number of comparators 142 in the embodiment shown is equal to the number of measurement circuits 21 implemented in measurement unit 12. Each comparator 142 is coupled to receive, on its inverting input, a measured voltage M (e.g., M0 for the uppermost comparator) from its correspondingly coupled measurement circuit 21. A reference voltage, Vref, is provided to the non-inverting input of each of comparators 142. The reference voltage is generated by a voltage divider circuit comprising resistors R1 and R2, which are collectively coupled between Vdd and ground. In this embodiment, resistors R1 and R2 are both variable resistors, and thus the reference voltage may be changed. However, embodiments in which the resistors have fixed resistance values are also possible and contemplated.

The outputs of comparators 142, e.g., C0, C1, C2, etc., may be provided to the register unit and/or an analog-to-digital converter (ADC) 146. Each comparator 142 may generate an output signal of a certain level responsive to performing a comparison. As noted above, in some embodiments, each comparator 142 may be configured to provide an output of one of two different levels, dependent on the comparison result. In such embodiments, a high level may be output if the measured voltage is less than the reference voltage (indicating a droop), while a low level is output is the measured voltage is greater than the reference voltage (indicating no droop).

In another embodiment, the magnitude of the output signal provided by comparators 142 may correspond to the magnitude of a voltage droop, if any. In such embodiments, the magnitude of the output signal may be proportional to the magnitude that the measured voltage is less than the reference voltage. In such embodiments, the output signal may be provided to ADC 146, which may in turn generate a digital value indicative of the magnitude of the voltage droop, if any occurred. If the digital value is, e.g., 000 (or in some cases, a low digital value), it may be an indication that no droop has occurred. The digital value may then be provided to register unit 16 and stored therein.

Figure 5:
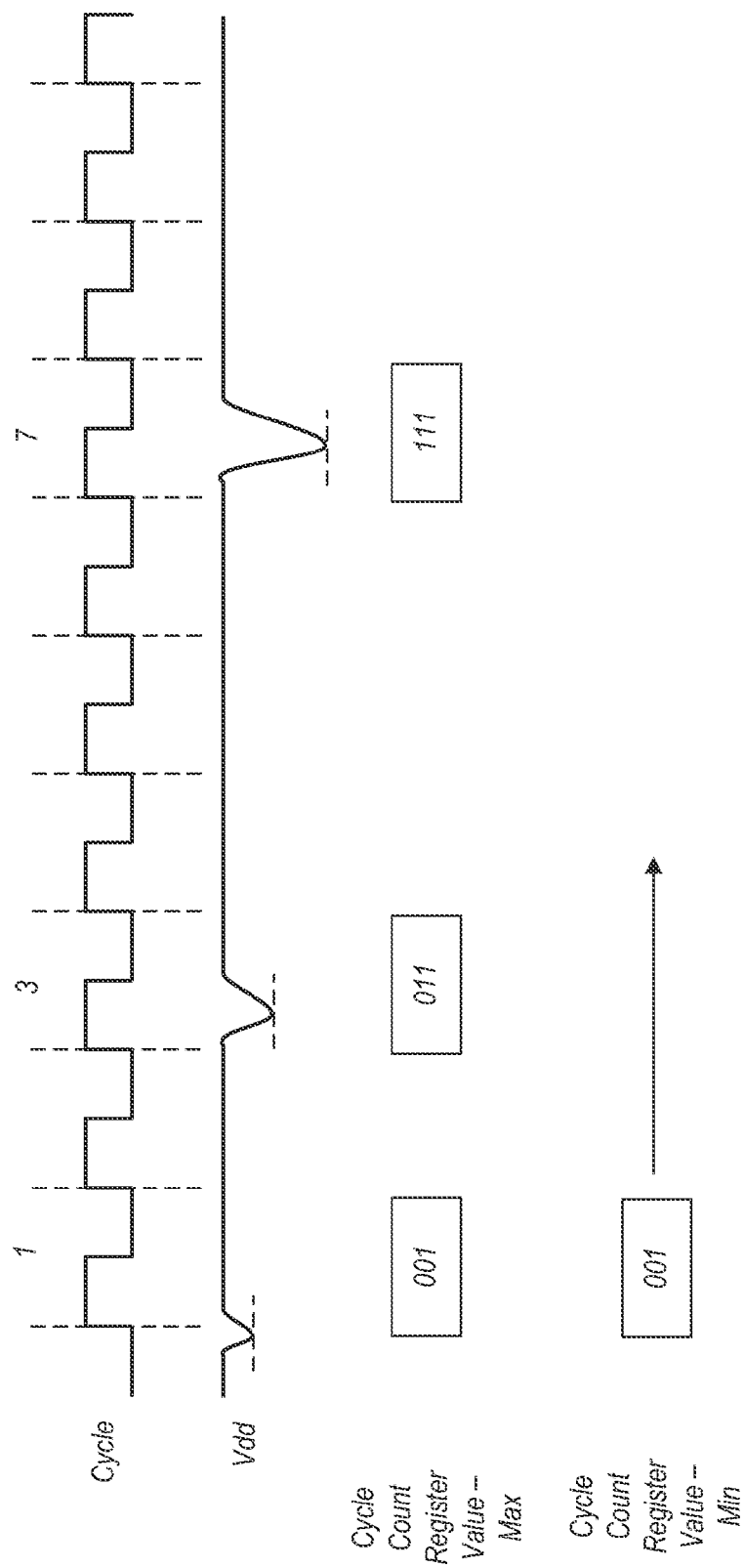
FIG. 5 is a timing diagram illustrating operation of one embodiment of an IC having a measurement circuit.

FIG. 5 is a timing diagram illustrating the operation of one embodiment of the circuitry discussed above. In the illustrated example, a waveform for the oscillator output and the voltage on Vdd is shown. In cycle 1, a small voltage droop is detected, and the cycle count register records the cycle as having a voltage droop. In embodiments that are so configured, the register unit may also record the voltage droop in cycle 1 as the maximum and minimum voltage droop (since it is the only one present at this time). In cycle 3, another voltage droop of a greater magnitude occurs, and the cycle upon which this occurred is recorded in the register unit. Additionally, since the droop has a greater magnitude than the previous one, it is recorded as the maximum droop (while the initial droop remains recorded as the minimum droop detected). Another droop is recorded at cycle 7, with the cycle being recorded and with the droop also replacing the previous droop as being the maximum droop detected.

Figure 6:
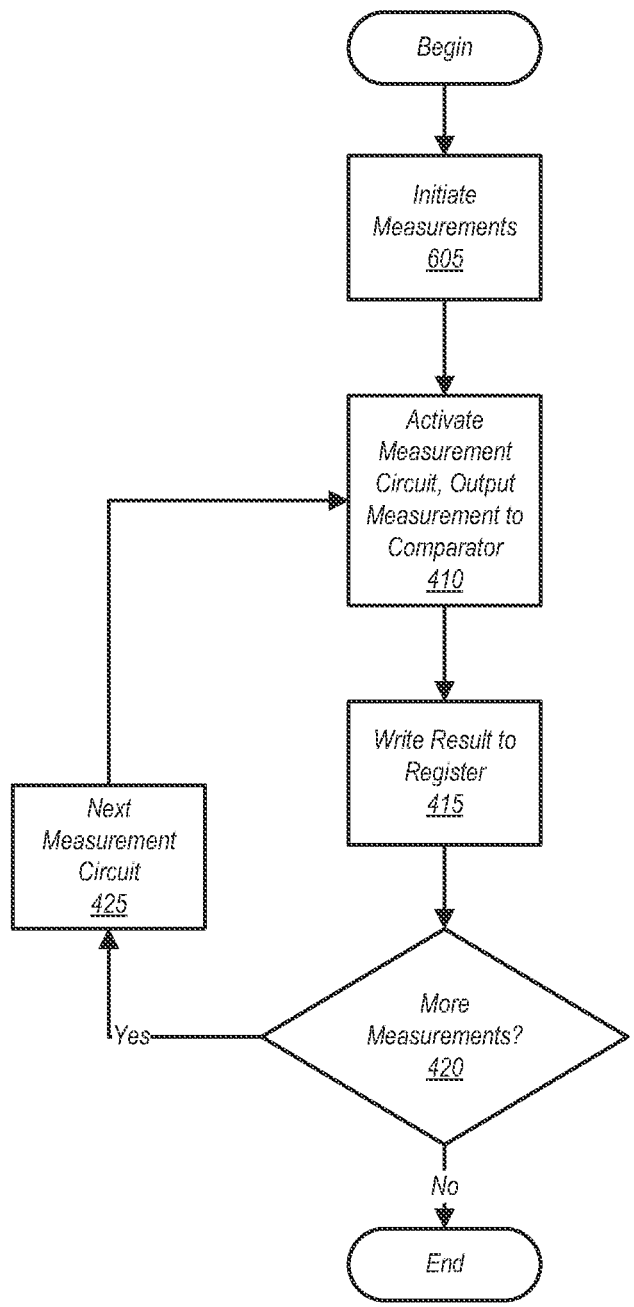
FIG. 6 is a flow diagram illustrating one embodiment of a method for performing voltage measurements in an IC.

FIG. 6 is a flow diagram of one embodiment of a method for operating measurement circuitry in an IC. While method 600 is directed to the circuitry above for recording instantaneous voltage drops(IVDs)/voltage droops, the method may be performed by other types of circuitry not discussed herein.

Method 600 begins with the initiation of measurements (block 605). Upon initiation of measurements, a first measurement circuit may be activated and may perform a voltage measurement, with the measurement being compared to a reference voltage (block 610). The occurrence or non-occurrence of a voltage droop may be determined based on the comparison. The result of the comparison may be written to a register unit (block 615). The results recorded may include the cycle in which the droop occurred, the magnitude of the droop, and whether the droop was a minimum or maximum (in terms of magnitude) droop detected. If more measurement circuits are to be activated block 620, yes), the method proceeds to activate the next circuit (block 625), while deactivating the previously active measurement circuit. The method then proceeds again through blocks 610, 615, and 620. If no more measurement circuits are to be activated (block 625, no), then method 600 concludes/.

Figure 7:
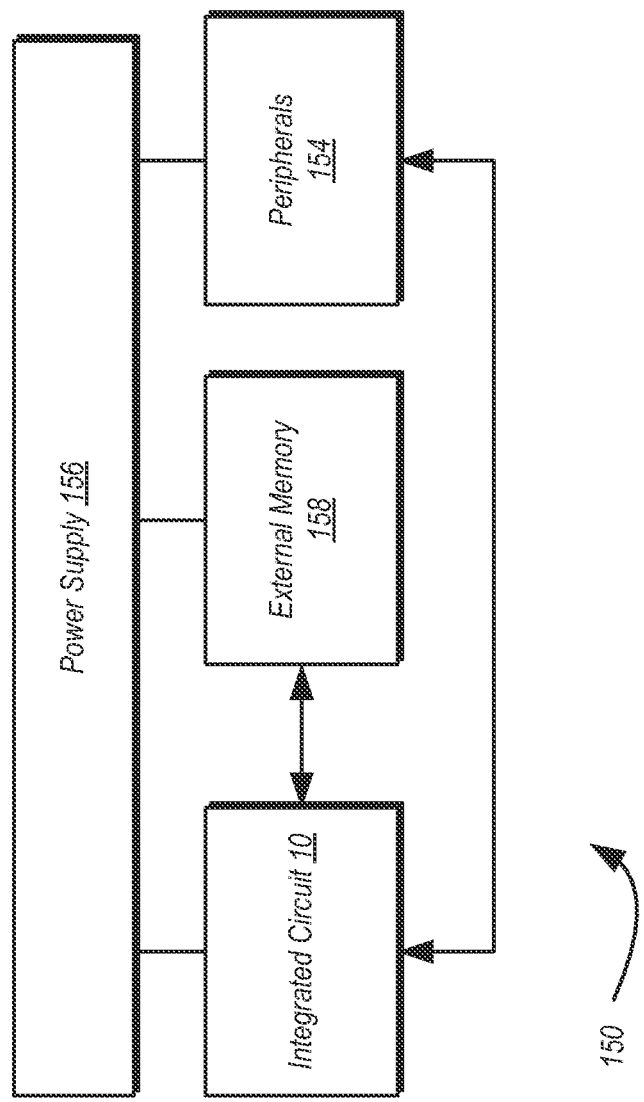
FIG. 7 is a block diagram of one embodiment of a system.

Turning next to FIG. 7, a block diagram of one embodiment of a system 150 is shown. In the illustrated embodiment, the system 150 includes at least one instance of the integrated circuit 10 coupled to external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
a measurement unit configured to perform a plurality of measurements of a voltage drop between a supply voltage node and a reference node, wherein the measurement unit is configured to perform the plurality of measurements by taking a single measurement in each of a plurality of consecutive measurement cycles, wherein the measurement unit comprises:
a plurality of measurement circuits;
a delay unit having a plurality of serially coupled delay elements and a plurality of taps, wherein each of the plurality of taps corresponds to one of the plurality of measurement circuits; and a ring oscillator having an output coupled to each of the plurality of measurement circuits;

a comparison unit configured to compare each of the plurality of measurements to a reference voltage; and a register unit configured to store results of each comparison performed by the comparison unit, and further configured to provide indications at which, if any, of the plurality of consecutive cycles a voltage drop occurred.

2. The integrated circuit as recited in claim 1, wherein the register unit is further configured to store indications of which of the plurality of consecutive cycles a maximum and minimum voltage drop occurred.

3. The integrated circuit as recited in claim 1, wherein each of the measurement circuits is configured to perform a measurement responsive to assertion of an enable signal.

4. The integrated circuit as recited in claim 3, wherein each of the measurement circuits includes first and second p-channel metal oxide semiconductor (PMOS) transistors coupled in series and an n-channel metal oxide semiconductor (NMOS) transistor coupled in series with the second PMOS transistor, wherein the second PMOS and the NMOS transistor for an inverter, and wherein each measurement circuit further comprises a capacitor coupled between the output of the inverter and the reference node.

5. The integrated circuit as recited in claim 4, wherein the first PMOS transistor is coupled between the supply voltage node and the second transistor, and wherein a gate terminal of the first PMOS transistor is coupled to a node coupling the first and second PMOS transistors.

6. The integrated circuit as recited in claim 1, wherein the comparison unit comprises a plurality of comparators, wherein each of the comparators includes a first input coupled to receive the reference voltage, and a second input coupled to an output of a corresponding unique one of a plurality of measurement circuits of the measurement unit.

7. The integrated circuit as recited in claim 1, wherein register unit includes a plurality of storage locations, wherein each of the storage locations corresponds to one of a plurality of comparators of the comparison unit.

8. The integrated circuit as recited in claim 1, wherein each of the plurality of measurement circuits is associated with a corresponding of a plurality of enable circuits, wherein each of the enable circuits is coupled to receive an output first signal from the ring oscillator and a delay signal from a correspondingly coupled one of the plurality of taps in the delay unit.

9. The integrated circuit as recited in claim 8, wherein each of the plurality of measurement circuits is configured to assert its respective enable signal responsive to assertion of the output signal from the ring oscillator and assertion of the delay signal at its correspondingly coupled one of the plurality of taps in the delay unit, wherein a correspondingly coupled one of the measurement circuits is activated responsive to receiving an asserted enable signal, and wherein the ring oscillator and delay unit are arranged such that only one measurement circuit is delayed at a time.

10. A method comprising:

sequentially performing a plurality of measurements of a voltage drop between a supply voltage node and a reference node, wherein each of the plurality of measurements is performed over a plurality of consecutive measurement cycles, and wherein each of the plurality of measurements is performed by a corresponding unique one of a plurality of measurement circuits, each of the measurement circuits including first and second p-channel metal oxide semiconductor (PMOS) transistors coupled in series and an n-channel metal oxide semiconductor (NMOS) transistor coupled in series with the second PMOS transistor, wherein the second PMOS and the NMOS transistor form an inverter, and wherein each measurement circuit further comprises a capacitor coupled between the output of the inverter and the reference node;

comparing, using a comparison unit, each of the plurality of measurements to a reference voltage;

storing results of each comparison in a register unit; and indicating at which, if any, of the plurality of measurement cycles a voltage drop occurred.

11. The method as recited in claim 10, further comprising storing, in the register unit, indications of which cycles a maximum voltage drop and a minimum voltage drop occurred.

12. The method as recited in claim 10, further comprising a ring oscillator and a delay line sequentially enabling the plurality of measurement circuits such only one measurement circuit at a time is active.

13. The method as recited in claim 10, wherein the comparison unit comprises a plurality of comparators, wherein each of the comparators includes a first input coupled to receive the reference voltage, and a second input coupled to an output of a corresponding unique one of a plurality of measurement circuits of the measurement unit.

14. An apparatus comprising:

a plurality of measurement circuits, wherein each of the measurement circuits is configured to measure a voltage drop between a supply voltage and a reference voltage, wherein each of the measurement circuits is configured to measure the voltage drop responsive to receiving a first signal from a delay chain and a second signal from a ring oscillator, wherein the delay chain and the ring oscillator are configured to cause the measurement circuits to be enabled one at a time each for a predetermined time period;

a plurality of comparators each coupled to a corresponding one of the measurement circuits, wherein each of the comparators is configured to compare the voltage drop from its respectively coupled measurement circuit to a reference voltage; and a cycle count register coupled to the plurality of comparators, wherein the cycle count register is configured to record at which clock cycles voltage drops occurred based on outputs received from the comparators.

15. The apparatus as recited in claim 14, wherein each of the measurement circuits includes first and second p-channel metal oxide semiconductor (PMOS) transistors coupled in series and an n-channel metal oxide semiconductor (NMOS) transistor coupled in series with the second PMOS transistor, wherein the second PMOS and the NMOS transistor for an inverter, and wherein each measurement circuit further comprises a capacitor coupled between the output of the inverter and the reference node.

16. The apparatus as recited in claim 15, wherein the first PMOS transistor is coupled between the supply voltage node and the second transistor, and wherein a gate terminal of the first PMOS transistor is coupled to a node coupling the first and second PMOS transistors.

17. The apparatus as recited in claim 15, further comprising:

a delay unit having a plurality of serially coupled delay elements and a plurality of taps, wherein each of the plurality of taps corresponds to one of the plurality of measurement circuits;

a ring oscillator having an output coupled to each of the plurality of measurement circuits;

wherein each of the plurality of measurement circuits is configured to be activated responsive to assertion of a signal on its correspondingly coupled one of the plurality of taps and assertion of a signal on the output of the ring oscillator.

18. The apparatus as recited in claim 14, wherein the cycle count register is configured to store indications of which of the plurality of consecutive cycles a maximum and minimum voltage drops occurred.

* * * * *